(12) United States Patent
Madrid et al.

(10) Patent No.: US 8,594,966 B2
(45) Date of Patent: Nov. 26, 2013

(54) DATA PROCESSING INTERFACE DEVICE

(75) Inventors: Philip E. Madrid, Austin, TX (US);
Stephen C. Ennis, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 500 days.

(21) Appl. No.: 12/388,593

(22) Filed: Feb. 19, 2009

(65) Prior Publication Data
US 2010/0211336 A1 Aug. 19, 2010

(51) Int. Cl.
*G01R 31/00* (2006.01)
*G06F 19/00* (2011.01)
*G06F 15/163* (2006.01)

(52) U.S. Cl.
USPC .............. 702/118; 702/130; 716/136

(58) Field of Classification Search
USPC .............. 702/57, 118, 130; 716/136
See application file for complete search history.

(56) References Cited

U.S. PATENT DOCUMENTS 7,007,254 B1    2/2006   Borkovic et al.
7,269,805 B1 *  9/2007   Ansari et al. .......... 716/136

FOREIGN PATENT DOCUMENTS

GB    2452271 A    3/2009
WO    9406210 A1   3/1994

OTHER PUBLICATIONS

Xilinx, "Virtex-5 Family Overview LX, LXT, and SXT Platforms", Xilinx DS100 (v3.2) Advance Product Sheet, Sep. 4, 2004, p. 3.*
Emmett J. Ientilucci, "Pro Tools R and Time Division Multiplexing (TDM)", pp. 1-20, 2007 http://www.cis.rit.edu/~ejipci/Reports/ProToosHD_and_TDM.pdf.*
Milica Mitic et al., "An Overview of On-Chip Bus", Milica Mitic, Facta Universitatis (NIS), Ser.: Elec. Energ. vol. 19, No. 3, Dec. 2006, 405-42 http://www.doiserbia.nb.rs/img/doi/0353-3670/2006/0353-36700603405M.pdf.*
Abdelkrim Zitouni et al., "Communication Architecture Synthesis for Multi-bus SoC", Journal of Computer Science 2 (1): 63-71, 2006.*
Kyeong Keol Ryu et al, "A Comparison of Five Different Multiprocessor SoC Bus Architectures", Digital Systems, Design, 2001. Proceedings. Euromicro Symposium 2001.*
IBM, "The CoreConnect™ Bus Architecture", International Business Machines Corporation, 1999 https://www-01.ibm.com/chips/techlib/techlib.nsf/techdocs/852569B20050FF77852569910050C0FB/$file/crcon_wp.pdf.*
IBM, "32-bit Processor Local Bus: Architecture Specifications", May 16, 2001, Version 2.9, http://crkit.orbit-lab.org/export/430/design/trunk/bfm/bfm_nt_12_1/third_party/doc/32bitPlbBus.pdf.*
IBM, "On-Chip Pewripheral Bus: Architecture Speciofications", Apr. 17, 2001, Version 2.1, http://crkit.orbit-lab.org/export/430/design/trunk/bfm/bfm_nt_12_1/third_party/doc/OpbBus.pdf.*
PCT International Search Report for PCT/US2010/024386, mailed Jun. 2, 2010, 3 pages.

* cited by examiner

*Primary Examiner* — Sujoy Kundu
*Assistant Examiner* — Regis Betsch

(57) ABSTRACT

Information of a first type is determined at an integrated circuit die of a data processing device included an integrated circuit package. The integrated circuit package includes the first integrated circuit die and a second integrated circuit die. Information of a second type is determined at the integrated circuit die. The first and second type of information is transmitted from the integrated circuit die to another integrated circuit die using a time-divided multiplexed protocol by transmitting the first information during a first time slot of the protocol and transmitting the second information during a second time slot of the protocol.

24 Claims, 3 Drawing Sheets

DATA PROCESSING INTERFACE DEVICE

BACKGROUND

1. Field of the Disclosure

The present disclosure relates generally to electronic devices, and more particularly to data processing devices.

2. Description of the Related Art

Very large-scale integration (VLSI) is the process of creating an integrated circuit (IC) by combining a large number of components at a single IC package. The IC package can include a single IC die or can include more than one IC die. An IC package that contains more than one IC die is referred to as a multi-chip module (MCM). For example, a data processing device that includes two individual microprocessor IC die can be implemented by including the two individual microprocessor IC die at a single MCM. Each IC die is manufactured individually and each IC die is bonded to a substrate included at the MCM package. The MCM package substrate includes conductors that provide electrical connections between the pins of each IC die and between pins of the IC die and external interface pins of the MCM. The conductors can carry data signals and reference signals.

The pins of an IC die are conductive structures, such as metalized pads to which wires are bonded, metal bumps that are disposed at a portion of the surface of the IC die, and the like. The individual pins of the IC die and corresponding conductors included at the MCM substrate are bonded together to provide electrical connections. Packaging technology limits how physically small these electrical connections can be and therefore limits the number of individual pins that can be incorporated on a particular IC die. Therefore, the number of pins that can be physically disposed at an IC die can limit the number of circuit components that can be included at an individual IC die. Providing a signal interface to multiple IC die incorporated at an MCM is particularly difficult.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A device and method are disclosed to provide a die-to-die communication link (DDCL) to facilitate the exchange of information of different types between two or more IC die included at a data processing device using a time-divided multiplexed protocol.

Figure 1:
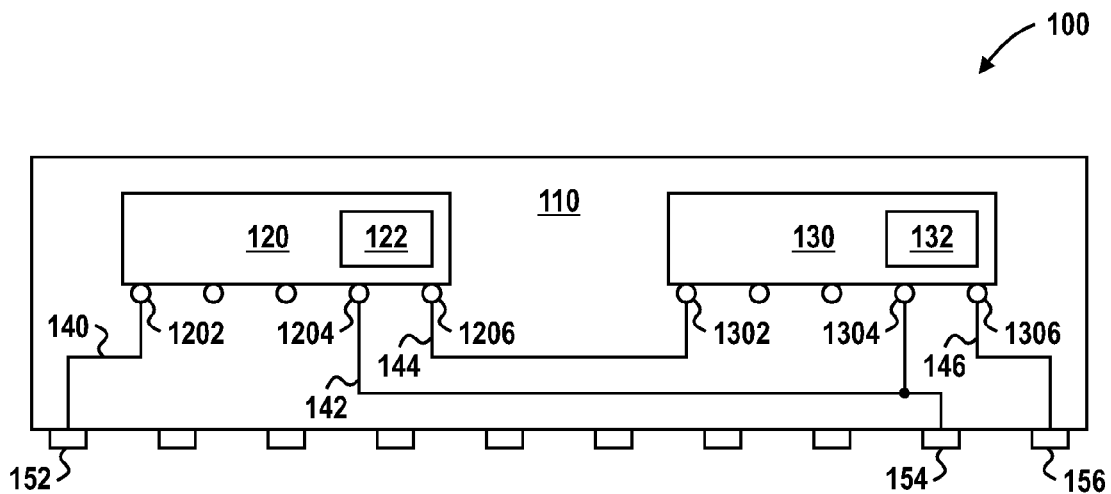
FIG. 1 illustrates a cross sectional view of a MCM included at a data processing system in accordance with a specific embodiment of the present disclosure.

FIG. 1 illustrates a cross sectional view of a MCM 110 included at a data processing system 100 in accordance with a specific embodiment of the present disclosure. MCM 110 includes IC die 120 and IC die 130, conductors 140, 142, 144, and 146, and external interface pins 152, 154, and 156. IC die 120 and IC die 130 each includes a die-to-die interface circuit (DDIC) to support the exchange of information between IC die 120 and IC die 130. IC die 120 includes DDIC 122 and pins 1202, 1204, and 1206. IC die 130 includes a DDIC 132 and pins 1302, 1304, and 1306.

IC die 120 has a pin 1202 connected to conductor 140, a pin 1204 connected to conductor 142, and a pin 1206 connected to conductor 144. IC die 130 has a pin 1302 connected to conductor 144, a pin 1304 connected to conductor 142, and a pin connected to conductor 146. MCM 110 has an external interface pin 152 connected to conductor 140, an external interface pin 154 connected to conductor 142, and an external interface pin 156 connected to conductor 146. Therefore, pins at IC die 120 and IC die 130 are each connected to corresponding conductors, such as conductors 140, 142, and 144 at MCM 110 to provide an electrical connection between pins of the IC die and the conductors at MCM 110.

A MCM such as MCM 110 can include hundreds of individual conductors, and each conductor can conduct signals to and from pins included at IC die 120 and IC die 130, or between a pins at an IC die and external interface pins of MCM 110, such as pins 152, 154, and 156. An external interface pin at MCM 110 can serve as an input, an output, or a bidirectional interface to MCM 110. For example, in an embodiment conductor 142 can conduct a clock signal received at pin 154 and provide that signal to pin 1204 at IC die 120 and pin 1304 at IC die 130. External interface pin 152 can be an output of MCM 110 to conduct a memory address originating at IC die 120 to a memory device at data processing system 100. A common external interface pin at MCM 110 can function as an output for signals conducted from both IC die 120 and IC die 130 by using tri-state or open-collector style drivers at each of the IC die. IC die 120 and IC die 130 can include data processing devices such as microprocessor devices, peripheral interface devices, another type of data processing device, or a combination thereof.

IC die 120 and IC die 130 each includes a DDIC module to support the exchange of information between each IC die. One IC die, such as IC die 120, is designated to be a master device, and remaining IC die are designated as slave devices. The IC die designated as the master device can serve as an exclusive interface between MCM 110 and data processing system 100 for a particular class of information. The master device can relay information between data processing system 100 and a slave device. Designation of an IC die as a master device can be achieved by bonding a pin at each IC die to an appropriate voltage reference. For example, a master pin associated with the master device can be connected to a logic-high voltage reference, while the master pin associated with slave devices can be connected to a logic-low voltage reference. The master device can relay information received via external interface pins of MCM 110 to a slave device using the DDCL, and can forward information originating at a slave device and received via the DDCL to data processing system 100. Thus, each IC die of MCM 110 does not require dedicated connections to external interface pins at MCM 110 in order to communicate with the other portions of data processing system 100. Logic circuitry associated with arbitration for the use of a shared external interface pin by multiple IC die can thereby be eliminated.

For example, IC die 120 can be designated at a master device and IC die 130 can be designated as a slave device.

Data processing system 100 can request the current operating temperature of IC die 130. Master IC die 120 receives the request via external interface pins at MCM 110 and uses DDIC 122 to transmit the request to DDIC 132 at slave IC die 130. Slave IC die 130 uses DDIC 132 to transmit the requested information back to DDIC 122 at master IC die 120. Master IC die 120 forwards the information to data processing system 100 via external interface pins at MCM 110. Master IC die 120 may further be designated as a master boot processor that is responsible for coordinating the proper initialization of slave devices. In one embodiment, master IC die 120 can use the DDCL to provide information to slave devices before the individual slave devices are configured to exchange information directly with an external memory device at data processing system 100.

Some requests originating outside MCM 110 can affect the timing of other communications between MCM 110 and data processing system 100. Such requests can be particularly problematic when they are received during a manufacturing test procedure because the test process can become non-deterministic. When a device such as MCM 110 is undergoing testing to verify that the manufactured device is fully functional, automatic test equipment (ATE) provides stimulus to external interface pins at MCM 110 and the ATE compares responses received at external interface pins of MCM 110 to expected responses. ATE typically requires that all responses be received at a precise and deterministic time. If an unexpected request is received at MCM 110 at a time that is non-deterministic relative to information being provided by the test procedure, responses from MCM 110 can be delayed, and the ATE may be unable to determine whether the device is functioning correctly.

For example, during testing, the ATE or other device may periodically request that IC die 130 provide temperature information from an on-die temperature sensor. Such a request can be issued at random times with respect to a test that is underway. In order to satisfy the request without disrupting the anticipated synchronous procession of the test, DDIC 122 and DDIC 132 use a time-divided multiplex protocol, which reserves particular time slots of the protocol for specific types of data. Thus, exchange of temperature information between IC die 120 and IC die 130 can take place during reserved time intervals so as not to interfere with other die-to-die communications. The DDCL can be used to exchange information between individual IC die to support a background task without interfering with the timing of a foreground task that is executing concurrently at each IC die.

Figure 2:
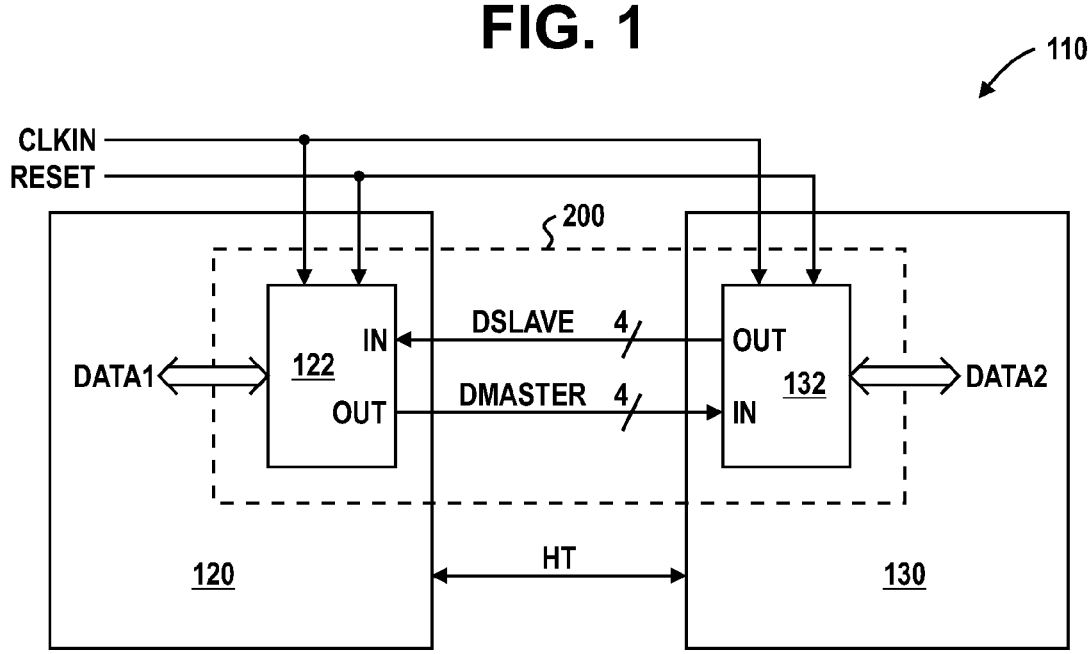
FIG. 2 is a block diagram illustrating the MCM of FIG. 1 including a die-to-die communication link (DDCL) in accordance with a specific embodiment of the present disclosure.

FIG. 2 is a block diagram illustrating MCM 110 including a DDCL in accordance with a specific embodiment of the present disclosure. MCM 110 includes IC die 120 and IC die 130. IC die 120 includes DDIC 122 and IC die 130 includes DDIC 132. DDIC 122 and DDIC 132 together implement DDCL 200 to provide a die-to-die communication link between IC die 120 and IC die 130. IC die 120 is connected to IC die 130 via a high-speed interface labeled "HT." DDIC 122 has a first input to receive a signal labeled "CLKIN," a second input to receive a signal labeled "RESET," a third input connected to a node labeled "DSLAVE," an output connected to a node labeled "DMASTER," and an interface labeled "DATA1." DDIC 132 has a first input to receive signal CLKIN, a second input to receive signal RESET, a third input connected to node DMASTER, an output connected to node DSLAVE, and an interface labeled "DATA2."

DDIC 122, included at IC die 120, and DDIC 132, included at IC die 130, each receive reset signal RESET and clock signal CLKIN from external interface pins at MCM 110. DDIC 122 and DDIC 132 use clock signal CLKIN to synchronize transmission and reception of information conducted via nodes DMASTER and DSLAVE. Nodes DMASTER and DSLAVE each can conduct a four-bit signal, and are used to communicate information between DDIC 122 and DDIC 132. In one embodiment, signal CLKIN is a 200 MHz clock signal provided by data processing system 100. The arrival of signal CLKIN at DDIC 122 can be skewed relative to the arrival at DDIC 132 due to circuit and interconnect imbalances. DDICs 122 and 132 are typically designed to operate correctly when receiving a clock signal with a duty cycle from 40% to 60% to account for imbalance in the arrival time of signal CLKIN.

During the assertion of signal RESET, DDIC 122 and DDIC 132 set their corresponding outputs to a logic-low value. Following the de-assertion of signal RESET, an initialization procedure is performed at each of DDIC 122 and DDIC 132. At particular times after the de-assertion of signal RESET, a data transmitter at DDIC 122 can transmit a valid bit. The valid bit is conducted via node DMASTER to an associated data receiver at DDIC 132. A data receiver at DDIC 132 recognizes the valid bit as an indication that a predefined time-divided multiplex sequence has begun. Independently, a data transmitter at DDIC 132 can perform the same procedure to establish synchronization with a data receiver at DDIC 122. The initialization sequence is further described with reference to FIG. 4.

DDIC 122 and DDIC 132 each has a local interface to communicate with logic modules at IC die 120 and IC die 130, respectively. DDIC 122 can exchange information with other logic modules at IC die 120 via interface DATA1, and DDIC 132 can exchange information with other logic modules at IC die 130 via interface DATA2. For example, IC die 120 can include individual logic modules, such as logic modules configured to support power management (PM) and side band interface (SBI) functions. Each of these modules at IC die 120 can communicate with a similar module at IC die 130 via the DDCL 200 using DDIC 122 and DDIC 132. DDIC 122 and DDIC 132 exchange information using a time-divided multiplexed protocol described in detail with reference to FIGS. 3 and 4.

High-speed interface HT is a Hyper Transport interface used to exchange information between IC die 120 and IC die 130, and between an IC die and data processing system 100. The HT interface is configured to support high-priority communications between individual data processing devices at data processing system 100, such as instructions and data information associated with a primary task being executed at IC die 120 and IC die 130. DDCL 200 can support exchange of information between IC die that is infrequent or of a relatively low priority compared to exchanges supported by the HT interface. Thus, the performance of the HT interface is not reduced as would be the case if bandwidth associated with the HT interface were reserved for the infrequent operations supported by DDCL 200.

Figure 3:
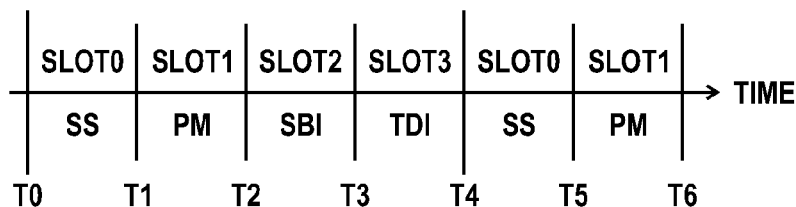
FIG. 3 is a graph illustrating a time-divided multiplexed protocol implemented by the DDCL of FIG. 2 in accordance with a specific embodiment of the present disclosure.

FIG. 3 is a graph 300 illustrating time-divided multiplexed protocol implemented by DDCL 200 of FIG. 2 in accordance with a specific embodiment of the present disclosure. Graph 300 includes a horizontal axis representing time. The horizontal axis of graph 300 is divided into successive intervals by time references T0, T1, T2, T3, T4, T5, and T6. An interval between time references T0 and T1 is labeled "SLOT0." An interval between time references T1 and T2 is labeled "SLOT1." An interval between time references T2 and T3 is labeled "SLOT2," and an interval between time references T3 and T4 is labeled "SLOT3." SLOT0, SLOT1, SLOT2, and SLOT3 each correspond to time slots specified in the time-divided multiplexed DDCL protocol and each time slot is dedicated to the transmission of particular bits of information. The sequence of four multiplexed time slots repeats as illustrated. Thus, time slot SLOT0 follows time slot SLOT3.

SLOT0 is associated with miscellaneous data, and labeled "SS." SLOT1 is primarily associated with power management information and is labeled "PM." SLOT2 is primarily associated with side band interface information and is labeled "SBI." SLOT3 is primarily associated with thermal data and is labeled "TD." A greater or lesser number of time slots in each repeating set of time slots can be implemented to accommodate a different number of data types. Specific time slots can be associated with data types based on requirements of a particular data processing device.

Figure 4:
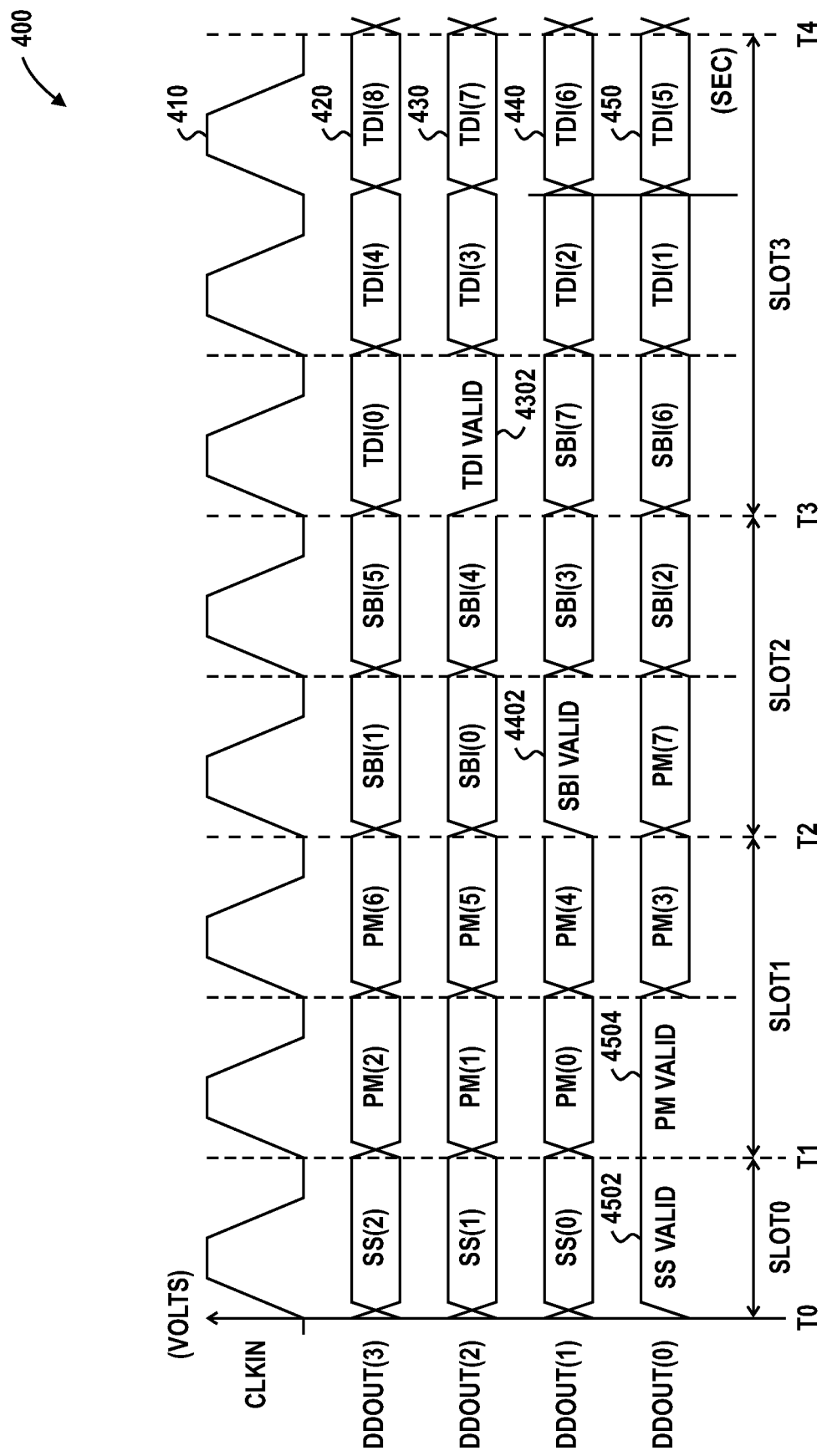
FIG. 4 is a timing diagram illustrating the time-divided multiplexed protocol implemented by the DDCL of FIG. 2 in accordance with a specific embodiment of the present disclosure.

FIG. 4 is a timing diagram 400 illustrating the time-divided multiplexed protocol implemented by DDCL 200 of FIG. 2 in accordance with a specific embodiment of the present disclosure. Timing diagram 400 has a horizontal axis representing time and a vertical axis representing voltage in units of volts. Waveform 410 represents a clock signal labeled "CLKIN," and waveforms 420, 430, 440, and 450 represent data signals labeled "DDOUT(0)," "DDOUT(1)," "DDOUT(2)," and "DDOUT(3)," respectively. Time references T0, T1, T2, T3, and T4 correspond to time references with the same name at FIG. 3. The interval between time references T0 and T1 corresponds to SLOT0. The interval between time references T1 and T2 corresponds to SLOT1. The interval between time references T2 and T3 corresponds to SLOT2, and the interval between time references T3 and T4 corresponds to SLOT3. Timing diagram 400 further includes valid bits SS VALID 4502, PM VALID 4504, SBI VALID 4402, and TDI VALID 4302.

Timing diagram 400 includes signal CLKIN that is used by each of DDIC 122 and 132 to synchronize the transmission and reception of data transmitted via DDCL 200. In one embodiment, DDIC 122 transmits data in response to the rising edge of clock signal CLKIN, and DDIC 132 receives and latches that data in response to the falling edge of clock signal CLKIN. Four bits of data are transmitted during each clock cycle and each bit of data is associated with a corresponding bit of signal DDOUT(3:0). Data that contains more than four bits of information is transmitted during subsequent cycles of clock signal CLKIN. Time slot SLOT0 in accordance with the specific embodiment disclosed has a duration corresponding to a single clock cycle. Time slots SLOT1 and SLOT2 each have a duration corresponding to two clock cycles, and time slot SLOT3 has a duration corresponding to three clock cycles. Each time slot is primarily associated with a particular data type.

Data is transmitted as a data stream where the first bit of each data type is preceded by a corresponding valid bit that is asserted when data of that data type is being transmitted. Data is transmitted in a little endian manner such that the least significant bit of each data type is transmitted first. Signal DDOUT(3:0) can represent data transmitted by either of DDIC 122 or DDIC 132, and conducted by either of interconnects DMASTER and DSLAVE at FIG. 2. For example, during the first clock cycle beginning at time reference T0, a valid bit associated with data type SS, SS VALID 4502, is transmitted via signal DDOUT(0). Three data bits SS(0), SS(1), and SS(2) are transmitted during the same clock cycle via signals DDOUT(1), DDOUT(2), and DDOUT(3), respectively.

Time slot SLOT0 is followed by time slot SLOT1. Time slot SLOT1 is allocated to the transmission of most of the bits of information corresponding to data type PM. Data type PM includes eight bits of information, and is preceded by a valid bit PM VALID 4504. For example, the valid bit associated with the PM data type, PM VALID 4504, is transmitted via signal DDOUT(0) and PM(0), PM(1), and PM(2) are transmitted via signal DDOUT(1), DDOUT(2), and DDOUT(3), respectively, during the same clock cycle. The second clock cycle included in time slot SLOT1 is used to transmit the next four bits of PM information via signal DDOUT(0), DDOUT(1), DDOUT(2), and DDOUT(3), respectively. The final bit of PM information, PM(7), is transmitted via signal DDOUT(0) during the first clock cycle of time slot SLOT2.

Time slot SLOT1 is followed by time slot SLOT2. Time slot SLOT2 is allocated primarily to the transmission of most of the bits of information corresponding to data type SBI. Data type SBI includes eight bits of information, and is preceded by a valid bit SBI VALID 4402. SB VALID 4402 is transmitted via signal DDOUT(1) during the first clock cycle of time slot SLOT1. SBI(0) and SBI(1) are transmitted via signal DDOUT(2) and DDOUT(3), respectively, during the same clock cycle. The second clock cycle included in time slot SLOT2 is used to transmit the next four bits of SBI information via signal DDOUT(0), DDOUT(1), DDOUT(2), and DDOUT(3), respectively. The final two bits of SBI information, SBI(6) and SBI(7), are transmitted via signal DDOUT(0) and DDOUT(1) during the first clock cycle of time slot SLOT3.

Time slot SLOT3 is primarily allocated to transmission of data corresponding to data type TDI. The valid bit associated with the TDI data type, TDI VALID 4302, is transmitted via signal DDOUT(2) during the first clock cycle of time slot SLOT3. In the particular example illustrated at FIG. 4, DDIC 122 does not have information of data type TDI to transmit at this particular time, so TDI VALID 4302 is not asserted. The receiver at DDIC 132 therefore ignores the associated TDI data bits during this particular time slot. In the event that there is no pending information of a particular data type to transmit during the allotted time slot, the transmitting DDIC sets the associated valid bit to a logic-low level and the receiving DDIC ignores the corresponding data bits following the inactive valid bit.

Even though information corresponding to more than one data type can be transmitted during a particular clock cycle, each bit of signal DDOUT(3:0) is reserved to represent one bit of one type of data for a particular time slot and clock cycle within that time slot. For example, the valid bit for data type SBI, SBI VALID 4402, is always transmitted via signal DDOUT(1) during the first clock cycle of time slot SLOT2. Time slot SLOT3 includes three clock cycles and is predominately associated with data type TDI, which includes nine bits of information. Time reference T4 corresponds to time reference T0 in so much as time slot SLOT0 immediately begins at time reference T4. The sequence of time slots SLOT0, SLOT1, SLOT2, and SLOT3 repeats every eight cycles of clock signal CLKIN.

DDCL 200 can support simultaneous transfer of information from master DDIC 122 to slave DDIC 132, and from slave DDIC 132 to master DDIC 122. Each of DDIC 122 and DDIC 132 includes a data transmitter and a data receiver, and the transmitter and receiver at a particular DDIC operate independently.

Before communication can commence via DDCL 200, the data receiver at each of DDIC 122 and 132 must be initialized so that it is synchronized to the corresponding data transmitter at DDIC 132 and 122, respectively. Each data transmitter independently issues an initial valid bit, SS VALID 4502, to the associated data receiver some time after signal RESET is de-asserted. Prior to sending the first valid bit, signal DDOUT (0) remains at an logic-low level. Receipt of the valid bit at a corresponding data receiver at a particular clock cycle indicates that that clock cycle represents the first cycle of time slot SLOT0. The eight clock-cycle repeating sequence begins and continues until signal RESET is again asserted. Each of DDIC 122 and DDIC 132 perform this initialization independently. Thus, the data receiver at DDIC 132 is synchronized to the data transmitter at DDIC 122, and the data receiver at DDIC 122 is synchronized to the data transmitter at DDIC 132. Data provided at DDOUT(3:1) associated with the initial valid bit SS VALID 4502 can be recognized as valid data. In another embodiment, the data associated with the initial valid bit SS VALID 4502 can be ignored.

The number of unique data types and the number of bits included in each data type illustrated at FIG. 4 is intended to demonstrate how particular data types can be allocated to specific portions of a time-divided multiplex data stream. A greater or lesser number of data types can be supported, and each data type can include a preferred number of information data bits. Thus, the number of clock cycles included in the repeating sequence depends on the total number of bits of information that DDCL 200 is configured to support. In a particular embodiment, the allocation of particular bits and data types to corresponding time slots, the number of time slots, and the number of clock cycles associated with each type of time slot can be reconfigured using programmable configuration registers associated with each DDIC. An additional programmable register can be included to enable and disable each DDIC module. In another embodiment, nodes DMASTER and DSLAVE can include a greater or a fewer number of conductors. For example, DDCL 200 can transmit and receive eight bits of information during each clock cycle.

The time-divided multiplexed protocol provided by DDCL 200 permits the exchange of information associated with random or asynchronous events to be interleaved with other device operations. For example, during a manufacturing test procedure ATE provides test stimulus to MCM 110, and IC die 120 and IC die 130 respond to the stimulus at a deterministic time. At the same time that the manufacturing test is underway, the ATE can issue a request for temperature information that is stored at a register at IC die 130. The request for thermal information is not associated with the prepared test stimulus. The request for temperature information is received at master IC die 120, and the request is relayed to slave IC die 130 via DDCL 200 during a time slot reserved for exchange of information of this data type. Slave IC die 130 transmits the requested temperature information to IC die 120 during an appropriate time slot, and master IC die 120 provides the information to the ATE via external interface pins of MCM 110. Because DDCL 200 reserves specific time slots for transferring temperature information, the manufacturing test procedure that is underway is not interrupted.

Figure 5:
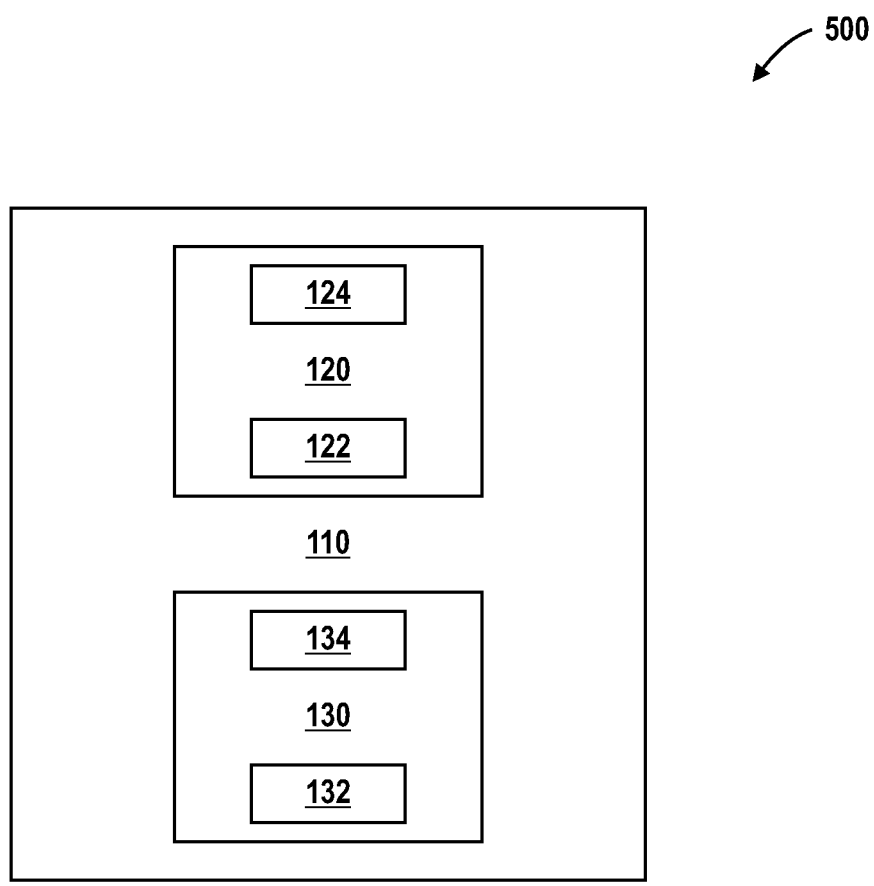
FIG. 5 illustrates a plan view of the MCM of FIG. 1 in accordance with a specific embodiment of the present disclosure.

FIG. 5 illustrates a plan view 500 of MCM 110 in accordance with a specific embodiment of the present disclosure. MCM 110 includes IC die 120 and IC die 130. IC die 120 includes DDIC 122 and DDIC 124, and IC die 130 includes DDIC 132 and DDIC 134.

IC die 120 and IC die 130 each include two DDIC modules. The two DDIC modules at each IC die are instantiated on opposite edges of the IC die. The DDIC module can be enabled independently to allow separate connections between three or more IC die, or mutually exclusive of each other to facilitate a single connection between two or more die. For example, one of the two DDIC modules can be enabled and the other is disabled based on the relative physical location of the two die within MCM 110. For example, if IC die 120 is positioned above IC die 130 at MCM 110, DDIC 122, which is instantiated at the bottom edge of IC die 120 is enabled, and DDIC 124 that is instantiated at the top edge of IC die 130 is disabled. In a corresponding manner, DDIC 134 that is instantiated at the top edge of IC die 130 is enabled, and DDIC 132 that is instantiated at the bottom edge of IC die 130 is disabled. Thus, DDIC 122 and DDIC 134 are configured to provide a DDCL to exchange information between IC die 120 and IC die 130. Replicating the DDIC modules permits identical IC die to be used interchangeably for both IC die included at MCM 110. Furthermore, using an appropriate DDIC module can reduce the length of conductors included at MCM 110, and the congestion of the conductors. Thus, signal propagation delay associated with DDCL 200 is also reduced. In another embodiment, a portion of a DDIC module is replicated on opposite edges of the IC die and the two replicated portions share the remaining portion of the DDIC module.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

For example, DDIC 122 and DDIC 132 can include additional inputs and outputs (not shown) to transmit and receive signals used during the testing of DDIC 122 and DDIC 132. In a particular embodiment, ATE can configure DDIC 122 and DDIC 132 time reference be operating in a test mode and test information can be scanned into and out of each DDIC module using a Joint Test Action Group (JTAG) interface. Furthermore, information can be exchanged between DDIC 122 and DDIC 132 during a test procedure using the additional inputs and outputs.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. In an integrated circuit package comprising a first integrated circuit die and a second integrated circuit die coupled via a first interface bus comprising a plurality of control lines and a plurality of data lines, a method comprising:
   determining first information of a first type at the first integrated circuit die;
   determining second information of a second type at the first integrated circuit die; and
   transmitting the first and second information from the first integrated circuit die to the second integrated circuit die over the first interface bus using a time-divided multiplexed protocol, wherein the time-divided multiplexed protocol reserves an interleaved series of at least a first time slot and a second time slot, the first time slot for transmitting the first type of information over at least a subset of the plurality of data lines and the second time slot for transmitting the second type of information over the subset of the plurality of data lines.

2. The method of claim 1, wherein the first information of the first type is indicative of a measured temperature of the first integrated circuit die.

3. The method of claim 1, further comprising:
receiving a request for the first information at a first input/output pin of the integrated circuit package, the first input/output pin not accessible by the first integrated circuit die via a direct electrical connection; and
providing the request for the first information from the second integrated circuit die to the first integrated circuit die in response to receiving the request.

4. The method of claim 3, wherein the first information is indicative of a temperature of the first integrated circuit die and the method further comprises:
determining a test result based on the second information, the second information based on a test pattern received at the integrated circuit package.

5. The method of claim 4, further comprising:
providing the first information via the first input/output pin of the integrated circuit package; and
providing the test result via a second input/output pin of the integrated circuit package.

6. The method of claim 4, wherein:
determining the test result comprises determining the test result in response to receiving the test pattern at a first time; and
determining the first information comprises determining the first information in response to receiving an information request at the first integrated circuit die at a second time, the first time having a non-deterministic relationship with the second time.

7. The method of claim 1, wherein the time-divided multiplexed protocol reserves a subset of the plurality of lines for transmitting information of the second type for the first time slot.

8. The method of claim 7, wherein transmitting the first and second information comprises:
transmitting, for a first clock cycle of the clock signal, the first information over a first subset of the plurality of lines and a first portion of the second information over a second subset of the plurality of lines; and
transmitting, for a second clock cycle of the clock signal following the first clock cycle, a second portion the second information over the plurality of lines.

9. The method of claim 1, wherein the first and second integrated circuit die are coupled via a second interface bus, the method further comprising:
communicating third information of a third type over the second interface bus.

10. The method of claim 9, wherein the third type comprises instruction data and the second type comprises thermal data.

11. A device comprising:
an integrated circuit package, comprising:
a first integrated circuit die; and
a second integrated circuit die coupled to the first integrated circuit die by a first interface bus comprising a plurality of control lines and a plurality of data lines;
wherein the second integrated circuit die is configured to:
determine first information of a first type;
determine second information of a second type; and
transmit the first and second information to the first integrated circuit die over the first interface bus using a time-divided multiplexed protocol that reserves an interleaved series of at least a first time slot and a second time slot, the first time slot for transmitting the first type of information over at least a subset of the plurality of data lines and the second time slot for transmitting the second type of information over the subset of the plurality of data lines.

12. The device of claim 11, wherein the first information is indicative of a measured temperature of the second integrated circuit die.

13. The device of claim 11, wherein:
the first number of clock cycles is one clock cycle; and
the second number of clock cycles is at least two clock cycles.

14. The device of claim 11, wherein the time-divided multiplexed protocol reserves a subset of the plurality of lines for transmitting information of the second type for the first time slot.

15. The device of claim 14, wherein the second integrated circuit die is configured to transmit the first and second information by:
transmitting, for a first clock cycle of the clock signal, the first information over a first subset of the plurality of lines and a first portion of the second information over a second subset of the plurality of lines; and
transmitting, for a second clock cycle of the clock signal following the first clock cycle, a second portion of the second information over the plurality of lines.

16. The device of claim 11, wherein:
the first and second integrated circuit die are coupled via a second interface bus; and
the first and second integrated circuit die are configured to communicate third information of a third type over the second interface bus.

17. The device of claim 16, wherein the third type comprises instruction data and the second type comprises thermal data.

18. The device of claim 16, wherein the third type comprises information associated with a primary task being executed by at least one of the first and second integrated circuit dies and the first and second types comprise information associated with infrequent tasks executed by at least one of the first and second integrated circuit dies.

19. An integrated circuit package comprising:
an input/output (I/O) pin;
a first integrated circuit die with a direct electrical connection to the I/O pin and a second integrated circuit die without a direct electrical connection to the I/O pin; and
a first interface bus coupling the first integrated circuit die and the second integrated circuit die, the first interface bus comprising a plurality of control lines and a plurality of data lines and implementing a time-divided multiplexed protocol that reserves an interleaved series of at least a first time slot and a second time slot, the first time slot for transmitting the first type of information over at least a first subset of the plurality of data lines and the second time slot for transmitting the second type of information over the first subset of the plurality of data lines;
wherein the first integrated circuit die is configured to:
request first information of the first type from the second integrated circuit die responsive to signaling received at the I/O pin;
receive a first portion of the first information from the second integrated circuit die over the first subset of the plurality of data lines during a clock cycle of the first time slot; and
receive, from the second integrated circuit die, a second portion of the first information over the first subset of the plurality of data lines and receive a second information of the second type over a second subset of the plurality of data lines during a clock cycle of the second time slot.

20. The integrated circuit package of claim 19, further comprising:
   a second interface bus coupling the first and second integrated circuit dies; and
   wherein the first and second integrated circuit dies are configured to communicate third information of a third type over the second interface bus.

21. The integrated circuit package of claim 20, wherein the third type comprises instruction data and the second type comprises thermal data.

22. The integrated circuit package of claim 20, wherein the third type comprises information associated with a primary task being executed by at least one of the first and second integrated circuit dies and the first and second types comprise information associated with infrequent tasks executed by at least one of the first and second integrated circuit dies.

23. The integrated circuit package of claim 20, wherein the signaling received at the I/O pin is representative of a test pattern for testing an operation of the integrated circuit package.

24. The integrated circuit package of claim 19, wherein:
   the first number of clock cycles is one clock cycle; and
   the second number of clock cycles is at least two clock cycles.

* * * * *